Oct. 31, 1967 L. A. ULE 3,350,234

FLEXIBLE SOLAR-CELL CONCENTRATOR ARRAY

Filed June 3, 1963

2 Sheets-Sheet 1

LOUIS A. ULE
INVENTOR.

BY [signature]

ATTORNEY

Oct. 31, 1967 L. A. ULE 3,350,234

FLEXIBLE SOLAR-CELL CONCENTRATOR ARRAY

Filed June 3, 1963 2 Sheets-Sheet 2

LOUIS A. ULE
INVENTOR.

BY M. Jabin

ATTORNEY

United States Patent Office 3,350,234

Patented Oct. 31, 1967

3,350,234

FLEXIBLE SOLAR-CELL CONCENTRATOR ARRAY

Louis A. Ule, Rolling Hills, Calif., assignor to Hoffman Electronics Corporation, a corporation of California Filed June 3, 1963, Ser. No. 285,447
7 Claims. (Cl. 136—89)

The present invention relates to solar-cell concentrator assemblies; and it relates more particularly to an improved reflective-radiator light-concentrator type of assembly which utilizes the capabilities of solar cells to the highest degree.

As is well known, the solar cell converts light energy into electrical energy. The most common solar cell is the silicon photovoltaic cell. The silicon cell includes a surface layer, and the exposure of the surface of the cell to light produces light absorption at the surface layer. Each light photon so absorbed by the surface layer of the silicon photovoltaic cell displaces an electron, and the net result is that the cell functions as an electric current generator. In the usual solar-cell panel, a plurality of these cells are connected in series and/or parallel to provide the desired voltage and current capabilities.

Solar-cell panels have found a wide range of utility. One particular use for the solar-cell panel in recent years has been in space vehicles. For example, solar-cell installations have been used in space probes, military and communication satellites, and the like. The power derived from such cells in response to incident sunlight is used in the space vehicles, for example, to excite the radio communication equipment.

The usual prior art solar-cell assembly for use, for example, in space vehicles has usually been in the form of rigid panels. A plurality of solar cells are mounted on the individual panels in the prior art arrangements, and the cells are interconnected electrically to provide the desired electrical power.

The ratio of cost and weight with respect to the generated electric power of the usual prior art solar-cell panel has been found to be excessively high. It has been found that one reason for this high ratio is the low percentage of actual available light which reaches the sensitive surface of the individual solar cells which make up the panel. For that reason, attempts have been made in the past to incorporate reflectors, and the like, into the solar-cell panels, so as to increase the concentration of solar energy reaching the sensitive surfaces of the solar cells.

The above-mentioned attempts have met with some success in the prior art in decreasing the ratio of weight and cost to generated power in the resulting assemblies. The present invention is particularly concerned with such a reflective, light-concentrator structure; and a primary object of the invention is to provide a reflective-radiator, light-concentrator solar-cell assembly which incorporates improved electrical, mechanical, thermal and optical features so as to increase its over-all efficiency and utility.

A more general object of the invention is to provide an improved reflector-radiator light-concentrator type of solar-cell panel assembly which utilizes the capabilities of solar cells to the highest degree so as to provide a relatively high amount of electric power at relatively low weight and cost of the generating assembly.

A more specific object of the invention is to provide such an improved reflector-radiator solar-cell panel assembly by which the light input to the solar cells in the assembly is increased by reflective light concentration; and in which the assembly exhibits relatively high radiating characteristics, so that the increase in reflective light concentration is achieved without unduly raising the temperature of the solar cells and thereby lowering their efficiency.

A further object is to provide such an improved reflector-radiator light-concentrator type of solar-cell assembly which is extremely reliable in its operation, and yet which can be manufactured simply and inexpensively.

Another object of the invention is to provide such an improved solar-cell assembly which includes light-reflective surfaces constructed in an improved manner to exhibit high reflective characteristics in the spectral range of the solar cells, and yet which has high emissivity so as to rapidly dissipate heat generated by the solar cells.

Yet another object of the invention is to provide such an improved type of solar-cell panel assembly which is light in weight, so as to be particularly adapted for mounting in space vehicles where weight considerations are of paramount importance.

A further object of the invention is to provide such an improved solar-cell light-concentrator panel assembly which includes a plurality of individual modular units intercoupled in side-by-side relationship to form either a rigid panel or a flexible array, whichever may be desired.

Yet a further object is to provide such an improved solar-cell panel assembly which is capable of resisting thermal shock and mechanical vibrations.

Another object is to provide such an improved solar-cell panel assembly which is easy to repair, and in which the modular construction enables malfunctioning components to be easily replaced.

The improved light-concentrator solar battery assembly of the invention is composed, in the embodiment to be described, of a plurality of honeycombed elongated trough-like modules. These modules are composed of a light metal, for example, such as aluminum; and their honeycomb configuration renders them extremely light in weight. A thin shell is provided for each of the modules, and this shell provides the reflective and mounting surfaces for the module.

The modules mentioned in the preceding paragraph can, as mentioned above, be assembled in side-by-side relationship into a rigid panel, if such is desired; or they may be formed into a jointed, articulated flexible array. The latter array is most convenient, as it can be wrapped around a curved surface, this being a convenient mounting arrangement for launching purposes. The panel assembly to be described is constructed so that when it is so mounted in the launching position it presents a convenient bearing surface for the curved mounting means, and it also is constructed so that when so mounted in the launching position, its sensitive surfaces face inwardly and are protected.

The construction to be described also incorporates improved electric connections which are not susceptible to fracture in the presence of high mechanical shocks. In addition, the individual modules are mechanically intercoupled in a spring-biased hinged relationship, in the embodiment to be described, so as to constitute a strong, rugged assembly from a mechanical standpoint.

Other objects and advantages of the invention will become apparent from a consideration of the following description, and when the description is taken in conjunction with the accompanying drawings, in which.

Figure 1:
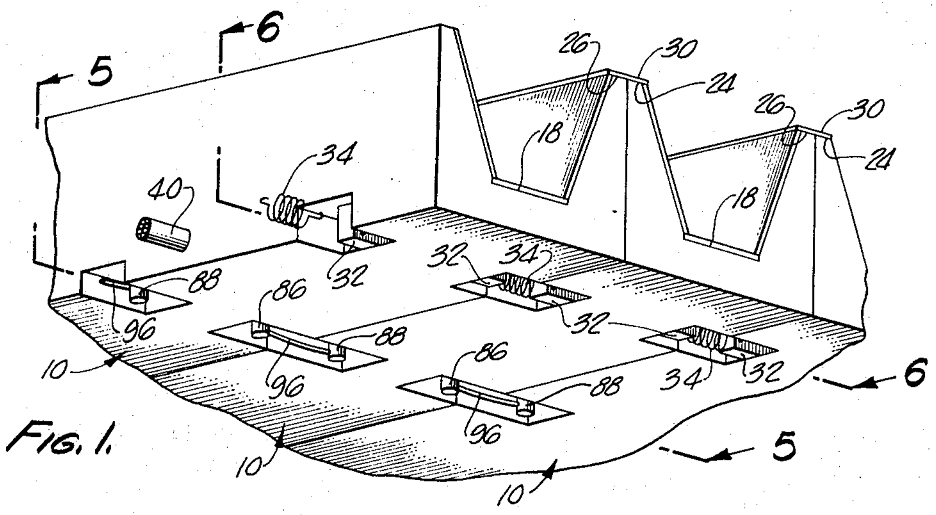
FIGURE 1 is a fragmentary perspective view showing a portion of a solar-cell reflective panel assembly constructed in accordance with one embodiment of the invention, and which is composed of a plurality of modules mounted in side-by-side relationship.

As illustrated in FIGURE 1, for example, an improved light-concentrator solar battery assembly constructed in accordance with one embodiment of the invention includes a plurality of elongated trough-like modules 10. The modules 10 are mounted in side-by-side relationship in the illustrated embodiment to form a jointed, articulated, flexible array.

Figure 2:
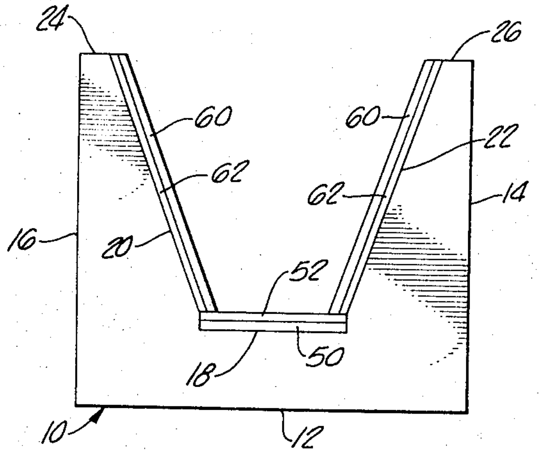
FIGURE 2 is an end view of one of the modules of FIGURE 1, and illustrating particularly an improved construction for the reflective surfaces of the module.

As shown in FIGURE 2, each of the elongated modules 10 may have a generally rectangular configuration. Each module may have dimensions of the order, for example, of 2 inches by 2 inches by 10 feet.

Each of the modules 10 includes a bottom surface 12. The modules 10 further include a pair of side surfaces 14 and 16, and each includes a mounting surface 18 which extends the length of the module parallel to the bottom surface 12. A pair of outwardly inclined surfaces 20 and 22 extend upwardly from the mounting surface 18, and these latter surfaces are inclined with respect to corresponding ones of the side surfaces 14 and 16. A pair of heat radiating bearing surfaces 24 and 26 extend the length of the module between the respective upper edges of the inclined surfaces 20 and 22 and the corresponding upper edges of the side surfaces 14 and 16.

Figure 6:
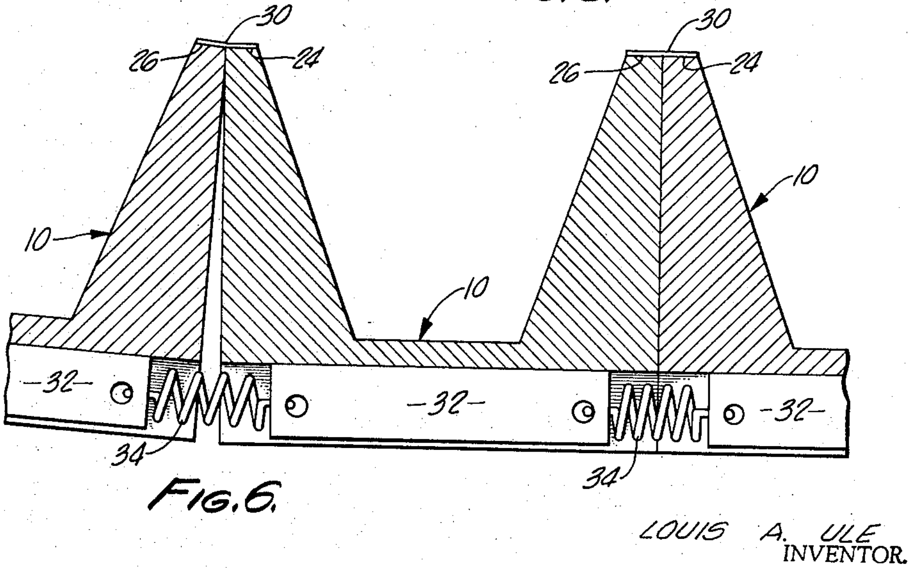
FIGURE 6 is a sectional view, taken substantially along the line 6—6 of FIGURE 1, and illustrating the means by which the individual units are mechanically coupled to one another.

The adjacent modules 10 in FIGURE 1 are mechanically joined to one another by flexible strap hinges, such as the hinges 30. These hinges are affixed to the heat-radiating bearing surfaces 24 and 26, and they extend along the length of the assembly. The strap hinges are shown in greater detail in FIGURE 6.

The hinged modules of FIGURE 1 are held in a spring biased manner in the illustrated planar configuration. This is achieved by a mechanical coupling which includes a plurality of links 32 (FIGURE 6) respectively associated with each of the modules 10 and extending transversely thereacross; and a corresponding plurality of coil springs 34 which intercouple adjacent ones of the links 32 to one another. It could also be achieved by other means, such as a continuous beryllium-copper strap spring which is cemented to the rear of each module.

The links 32 can be formed, for example, of glass reinforced epoxy resin, or of any other suitable material. The springs 34 may incorporate, for example, appropriate mechanical damping and appropriate mechanical stops so as to limit the arcuate bending of the modular assembly about the hinge axes.

In practice, it is preferable to thread a spring loaded safety cable 40 transversely through the adjacent modules 10. The safety cable threading through the array may be held taut by a spring at one end. This spring may be mounted inside a dash pot. The safety cable serves as a positive spring means for returning the modular array from a curved to a flat planar position. Also, the mechanical damping provided by the dash pot serves to prevent destructive whiplash upon the deployment of the array. Moreover, the safety cable assembly serves as a mechanical stop to limit the extent to which the flexible modular array may be wrapped around the curved launching surface, and may replace completely the links 32 or other strap spring.

As mentioned above, the improved construction of the present invention permits the array of modules 10 to be wrapped around a curved surface of the space vehicle in the launch configuration. In the launch configuration, the arrays constructed in accordance wtih the invention may measure up to ten feet in length and several feet in width; and these arrays are wrapped around the typically curved surface of such vehicles.

When in the above-mentioned launching position, the surfaces 24 and 26 serve as bearing surfaces; and the mounting surface 18 of each module, and the sensitive cells mounted thereon, are held in a protected facing-in position with respect to the curved surface of the missile. In this manner, considerable protection is afforded against both weather and aerodynamic buffeting. The exposed inactive surface of the array is made strong enough to withstand thermal and mechanical shocks.

When the space vehicle supporting the modular array of the invention has been launched, and the array is ready for use, appropriate mounting bands are removed by any appropriate control, and the springs 34 and the spring biased safety cable 40 cause the flexible array to straighten out and assume its operative planar configuration.

As shown in FIGURE 2, a plurality of light sensitive cells, such as the solar cell 50, are mounted on the mounting surfaces 18 of the modules 10. These solar cells are protected by a conventional glass cover 52. The inclined surfaces 20 and 22 of each module serve as reflective surfaces. These surfaces make it possible to reflect sunlight to the solar cells mounted on surface 18 at the bottom of the trough. It is also important that the reflective surfaces 20 and 22 serve to conduct heat away from the solar cells and to radiate the heat, so that the solar cells will not become excessively heated. It is well known that the efficiency of the solar cells drops as their temperature rises.

A requirement for the reflective surfaces 20 and 22, therefore, is to provide high reflectivity in the spectral range of the solar cell sensitivity, that is, in a range of wavelengths extending, for example, from 0.4–3 microns. It is also desirable for the reflective surfaces 20 and 22 to exhibit a high emissivity at around 60° centigrade.

The reflective surfaces 20 and 22 may be formed of aluminum sheet, for example. An appropriate aluminum sheet for this purpose is presently being marketed by the Aluminum Company of America, and is designated by them by the trade name "Alzak." This sheet is extremely light, and it includes a pure aluminum layer on each side. One side of the sheet is highly polished, so as to serve as the reflective surface. The sheet, however, exhibits relatively low emissivity. This can be increased, however, by a heavy anodizing of the sheet. The resulting structure has been found to provide approximately 75% reflectivity in the spectral range of the solar cell, and 65% emissivity at 60° centigrade. The anodized surface does not survive the vacuum and ultraviolet environment of space.

In the construction of FIGURE 2, however, the reflective surfaces are formed differently and in the following manner: A transparent member 60 is provided. This transparent member may, for example, be an extremely thin glass sheet. Glass sheets of the type presently marketed by the Corning Company, and designated by them by the trade name "Microsheet," are suitable for this purpose. These glass sheets have a thickness, for example, of .006 inch.

The transparent members 60 are provided with a silver backing 62 to render them reflective. This silver backing is applied by any appropriate means. The silver-backed transparent members are then attached to the surfaces 20 and 22 by any appropriate adhesive.

The resulting reflective surfaces, constructed in the manner shown in FIGURE 2, have high emissivity, as a result of the inherent high emissivity of the transparent sheet. Also, a 90% reflectivity is easily achieved over the desired range.

An advantage of the construction of FIGURE 2, when silver is used as the backing material, is that the reflectivity of silver drops in the spectral range below .4 microns. This is advantageous in that it prevents the ultraviolet light existing at that range in the spectrum from being reflected to the solar cell. This light adds little or nothing to the electrical output of the cells, and yet it has a tendency to degrade the adhesive holding the solar cells in place on the mounting surface 18, to increase the temperature, and to lower the efficiency.

Figure 3:
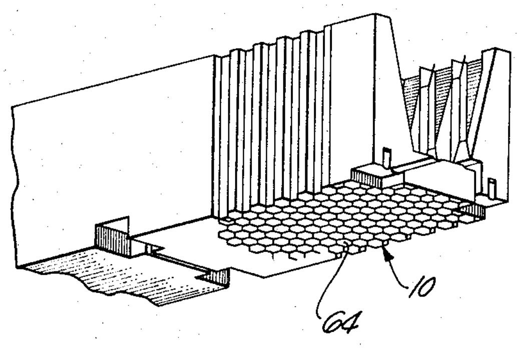
FIGURE 3 is a fragmentary perspective view of a module constructed in accordance with one of the aspects of the invention, and including a honeycomb configuration so as to be light in weight.
Figure 4:
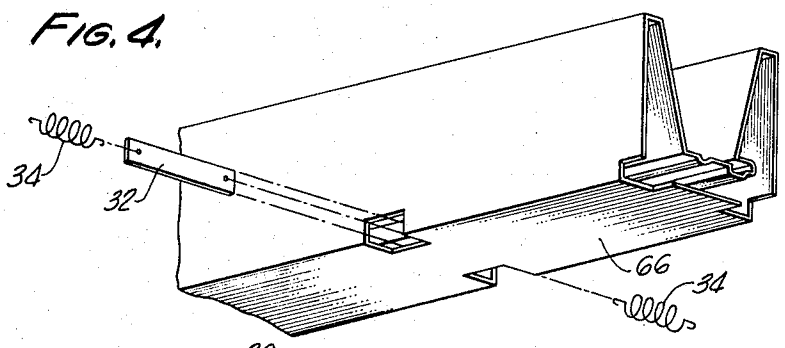
FIGURE 4 is a perspective view of a skin, or shell, member which is adapted to fit over the honeycomb module of FIGURE 3 so as to provide reflective and other surfaces for the module.

As illustrated in FIGURES 3 and 4, the individual modules 10 preferably have a honeycomb construction, so that they will be relatively light in weight. As illustrated, the honeycomb structure 64 of FIGURE 3 has the trough-like elongated configuration described above. A skin, or shell, member 66 (FIGURE 4) is adapted to fit over the honeycomb member 64, so as to provide the surfaces of the module, as described above. The shell 66 may conveniently be formed of aluminum or other light material.

As mentioned above, and as shown in more detail in FIGURE 5, the solar cells 50 are mounted on the mounting surface 18. The cells are mounted on the mounting surface by first coating the mounting surface with a suitable adhesive, such as a silicone glue. The assembled solar cell sub-assemblies, including the cells and interconnecting electrical straps (to be described) are then dropped into place and the adhesive is allowed to set.

The solar cells are electrically inter-connected, so that the desired power and voltage levels may be achieved. The cells in each module 10 are connected in parallel by a first conductive strap 80 which is soldered, or otherwise secured to one surface of the cell, and which extends along the length of the module. A second conductive strap 82 is soldered, or otherwise attached to the other surface of the cell, and it too extends along the length of the module to connect the cells in parallel.

Figure 5:
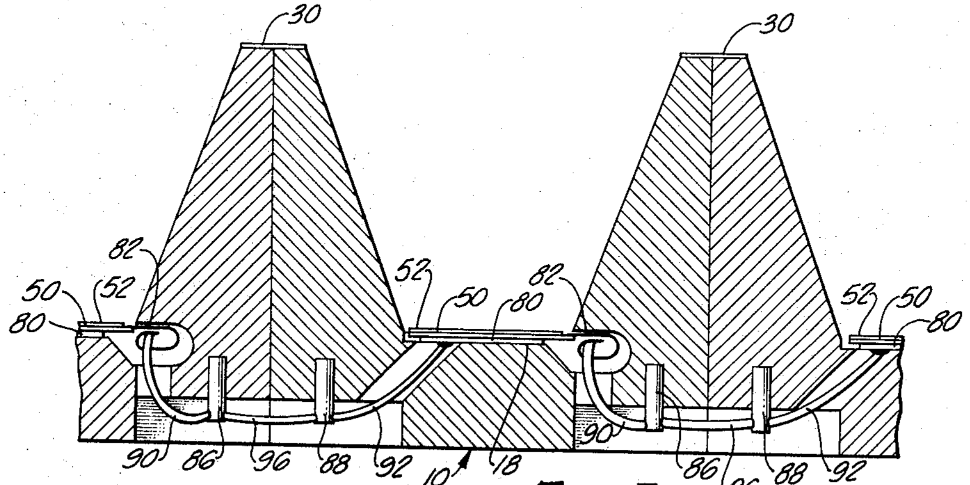
FIGURE 5 is a sectional view, taken substantially along the line 5—5 of FIGURE 1, and showing the electrical connections to the solar cells supported in the assembly.

The strap 82 curls around the edge of the individual solar cells 50, as shown in FIGURE 5, and into an adjacent channel 84 in the module. This strap has a tenuous configuration, so as to provide a stress relief and thereby eliminate electrical failure. The straps 80 and 82 are preferably made of a material, such as Kovar, to protect against failure caused by thermal expansion.

Electrical terminals are formed in the individual modules 10, as indicated at 86 and 88 in FIGURE 5, and these terminals extent into channels which, in turn, extend along the length of each module. Flexible electrical jumpers 90 and 92 extend from respective ones of the conductor straps 80 and 82 to the terminals 86 and 88. The jumpers are soldered to the terminals. Then, to interconnect each of the adjacent modules electrically, it is merely necessary to solder a jumper 96 to the adjacent terminals 86 and 88. This provides a feature in that each module can be completely fabricated and tested before assembly into the array.

The invention provides, therefore, an improved solar-cell panel assembly. The improved assembly described above is advantageous in that it is flexible in its construction; the assembly being formed of a plurality of separate modules and mounted in a side-by-side relationship.

While a particular embodiment of the invention has been shown and described, modifications may be made, and it is intended in the claims to cover such modifications which fall within the spirit and scope of the invention.

I claim:

1. A reflective-radiator solar-cell panel assembly including:

(a) a plurality of elongated trough-like modular members mounted in side-by-side relationship, each of said trough-like members having reflective surfaces;

(b) solar cell means mounted on said modular members in position to receive reflected energy from said reflective surfaces;

(c) hinge means intercoupling adjacent ones of said modular members; and (d) spring means for resiliently biasing the hinged modular members into a planar configuration.

2. The assembly defined in claim 1 in which each of said modular members has a rectangular configuration with a bottom surface and two side surfaces, said members each further having a mounting surface for said solar cell means extending its length parallel to said bottom surface and having a pair of outwardly inclined reflective surfaces extending upwardly from said mounting surface at an inclination relative to respective ones of said side surfaces.

3. The assembly defined in claim 1 in which each of said modular members is formed of a honeycomb structure, and each includes a shell member having a rectangular configuration with a bottom surface and two side surfaces, said shell member of each of said modular members further having a mounting surface for said solar cell means extending along its length parallel to said bottom surface and having a pair of outwardly inclined reflective surfaces extending upwardly from said mounting surface at an inclination relative to respective ones of said side surfaces, and a pair of heat-radiating top bearing surfaces, each extending along the length of said shell member between the upper edge of one of said reflective surfaces and the upper edge of the corresponding one of said side surfaces, and in which said hinge means are mounted on said heat-radiating top bearing surfaces.

4. The assembly defined in claim 1 and which includes a spring-loaded safety cable extending transversely through said modular members for limiting the hinged movement of said modular members.

5. A flexible solar-cell concentrator array comprising:

(a) a plurality of elongated trough-like modular members mounted in side-by-side relationship, each of said trough-like members having a rectangular cross-sectional configuration with a bottom surface, a pair of side surfaces, a pair of reflective surfaces, a pair of top bearing surfaces, and a mounting surface;

(b) solar-cell means affixed to said mounting surface, said mounting surface extending along the length of said modular member substantially parallel to said bottom surface, said reflective surfaces being oppositely outwardly inclined and extending upwardly from said mounting surface at an inclination relative to respective ones of said side surfaces, said reflective surfaces each including a transparent member having a silver backing to render the transparent member reflective to radiant energy through a particular spectral range, and said top bearing surfaces each extending along the length of said modular member between the upper edge of one of said reflective surfaces and the upper edge of the corresponding one of said side surfaces, (c) hinge means mounted on said top bearing surfaces for intercoupling adjacent ones of said modular members, and (d) spring means for resiliently biasing said hinged modular members into a planar configuration.

6. A flexible solar-cell concentrator array comprising:

(a) a plurality of elongated trough-like modular members mounted in side-by-side relationship, each of said modular members including a honeycomb core and a shell member having a rectangular cross-sectional configuration with a bottom surface, a pair of side surfaces, a pair of reflective surfaces, a pair of top bearing surfaces, and a mounting surface;

(b) solar cell means affixed to said mounting surface, said mounting surface extending along the length of said modular member substantially parallel to said bottom surface, said reflective surfaces being oppositely outwardly inclined and extending upwardly from said mounting surface at an inclination relative to respective ones of said side surfaces, said reflective surfaces each including a transparent member having a silver backing to render the transparent member reflective to radiant energy through a particular spectral range, and said top bearing surfaces each extending along the length of said modular member between the upper edge of one of said reflective surfaces and the upper edge of the corresponding one of said side surfaces, (c) hinge means mounted on said top bearing surfaces for intercoupling adjacent ones of said modular members, and (d) spring means for resiliently biasing said hinged modular members into a planar configuration.

7. A concentrator array as defined in claim 6 including, in addition, an electrical conduit adjacent said mounting surface, said conduit being shielded from incident radiation by one of said reflective surfaces and said solar cell means so as to provide ample space for an electrical connection to said solar cell means without being an inactive area which is exposed to incident radiation.

References Cited

UNITED STATES PATENTS

| | | | |
|---|---|---|---|
| 2,904,612 | 9/1959 | Regnier | 136—89 |
| 2,919,298 | 12/1959 | Regnier et al. | 136—89 |
| 2,989,575 | 6/1961 | Wallace | 136—89 |
| 3,005,970 | 10/1961 | Rochard et al. | 136—89 X |
| 3,232,795 | 2/1966 | Gillette et al. | 136—89 |

OTHER REFERENCES

Dale, B., et al.: Proc. 14th Ann. Power Sources Conf., October 1960, pp. 22–25.

Herchakowski, A., et al.: Proc. 15th Ann. Power Sources Conf., October 1961, pp. 120–124.

Johnson, A. L.: "Spacecraft Radiators," in Space/Aeronautics, January 1962, pp. 76–82.

Mann, A.: Proc. 14th Ann. Power Sources Conf., October 1960, pp. 28–32.

ALLEN B. CURTIS, *Primary Examiner.*

WINSTON A. DOUGLAS, *Examiner.*

A. M. BEKELMAN, *Assistant Examiner.*